(12) United States Patent
Freytag et al.

(10) Patent No.: US 7,078,902 B2
(45) Date of Patent: Jul. 18, 2006

(54) RADIO FREQUENCY RESONATOR SYSTEM WITH OPTIMIZED CURRENT DISTRIBUTION IN THE CONDUCTING ELEMENTS

(75) Inventors: Nicolas Freytag, Binz (CH); Daniel Marek, Moeriken (CH)

(73) Assignee: Bruker Biospin AG, Faellanden (CH)

( * ) Notice: Subject to any disclaimer, the term of this patent is extended or adjusted under 35 U.S.C. 154(b) by 0 days.

(21) Appl. No.: 11/094,260

(22) Filed: Mar. 31, 2005

(65) Prior Publication Data

US 2005/0237060 A1    Oct. 27, 2005

(30) Foreign Application Priority Data

Apr. 24, 2004   (DE) ................. 10 2004 020 167

(51) Int. Cl.
*G01V 3/00*  (2006.01)
(52) U.S. Cl. ........................ 324/318; 324/309
(58) Field of Classification Search ............. 324/318, 324/319, 322, 309, 307, 300; 600/407; 333/227, 333/219
See application file for complete search history.

(56) References Cited

U.S. PATENT DOCUMENTS

| | | | |
|---|---|---|---|
| 5,276,398 A | 1/1994 | Withers | |
| 5,351,007 A | 9/1994 | Withers | |
| 5,565,778 A | 10/1996 | Brey | |
| 5,585,723 A | 12/1996 | Withers | |
| 5,594,342 A | 1/1997 | Brey | |
| 5,619,140 A | 4/1997 | Brey | |
| 5,886,596 A * | 3/1999 | Vaughan, Jr. | 333/219 |
| 6,121,776 A | 9/2000 | Marek | |
| 6,452,393 B1 * | 9/2002 | Allen et al. | 324/318 |
| 6,556,013 B1 * | 4/2003 | Withers | 324/322 |
| 6,590,394 B1 * | 7/2003 | Wong et al. | 324/318 |
| 6,605,945 B1 | 8/2003 | Marek | |
| 6,727,700 B1 * | 4/2004 | Marek | 324/318 |
| 2002/0067167 A1 | 6/2002 | Romo | |
| 2003/0071623 A1 | 4/2003 | Marek | |
| 2003/0151409 A1 | 8/2003 | Marek | |
| 2004/0032262 A1 | 2/2004 | Withers | |

\* cited by examiner

*Primary Examiner*—Brij B. Shrivastav
(74) *Attorney, Agent, or Firm*—Paul Vincent

(57) ABSTRACT

A radio-frequency (RF) resonator system, in particular, for an NMR (nuclear magnetic resonance) probe head, with at least one RF resonator which comprises at least three non-interrupted conducting elements (21; 54, 56, 58; 75, 76; 91–94; 111a–111d; 131, 132a–132b; 169a–169f) which form at least one window (57; 77a; 124, 124a) in the RF resonator, wherein only part of the conducting elements delimits the at least one window, wherein the conducting elements are coupled through electromagnetic fields, wherein each conducting element has a limiting current density, is characterized in that the eigen-resonances of the individual conducting elements and/or the electromagnetic coupling between the conducting elements is/are selected such that upon excitation of the RF resonator system, the maxima of the quotient values along the individual conducting elements are substantially equal for all conducting elements, wherein these quotient values are defined as a quotient between an average current density which occurs in a cross-section of the conducting elements and the respective local limiting current density, or in that peak-shaped current excesses (143a–143f) which may occur mainly in the edge region of packets of conducting elements (131, 132a, 132b), in particular, at the edge of windows (124, 124a) along individual conducting elements (132a, 132b) or along conductor groups of several conducting elements (132a, 132b) are substantially eliminated. The RF resonator system thereby allows large RF magnetic field strengths.

24 Claims, 13 Drawing Sheets

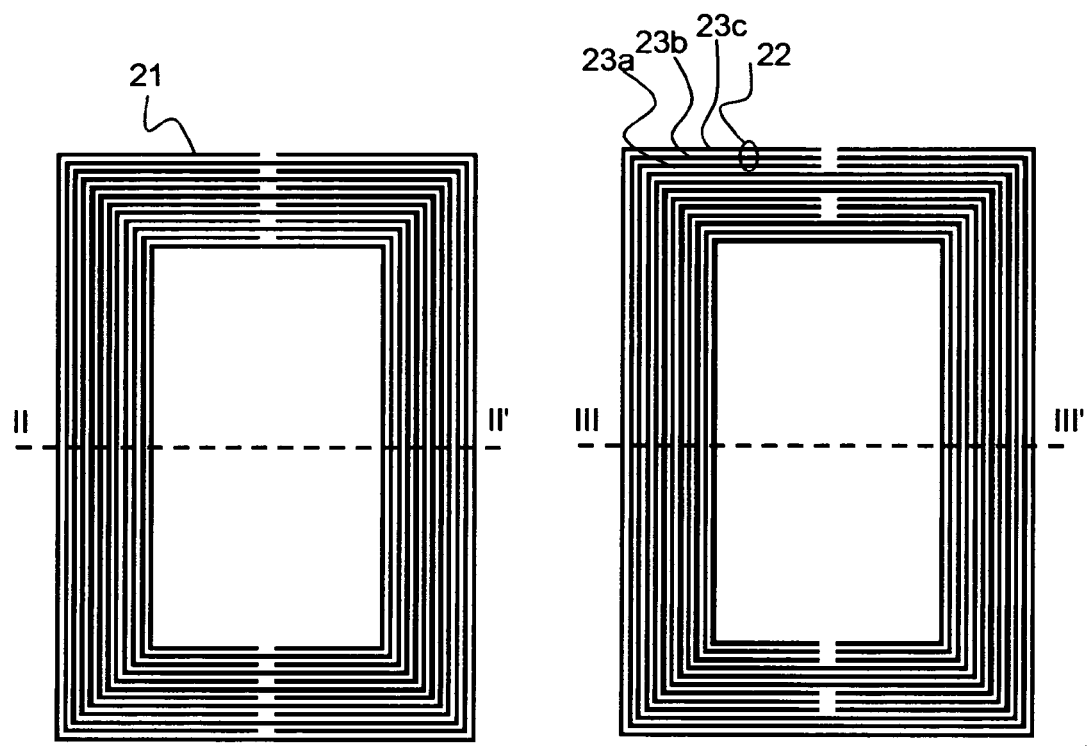
Fig. 2a
Prior Art
Fig. 3a
Prior Art
Fig. 2b
Fig. 3b
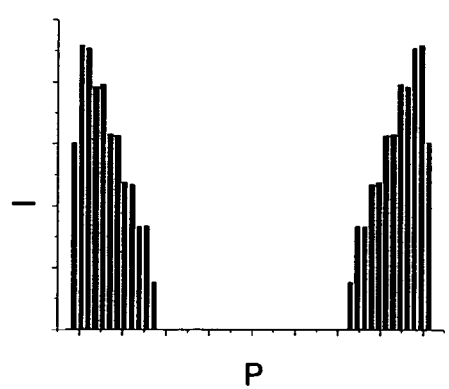
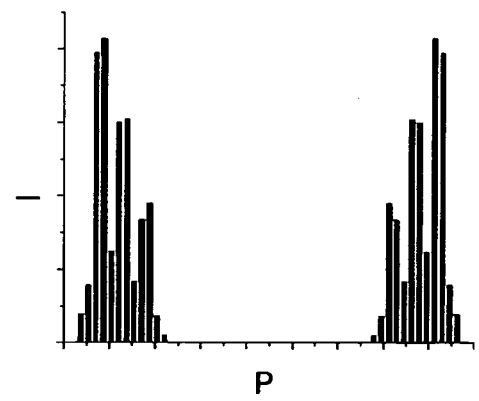

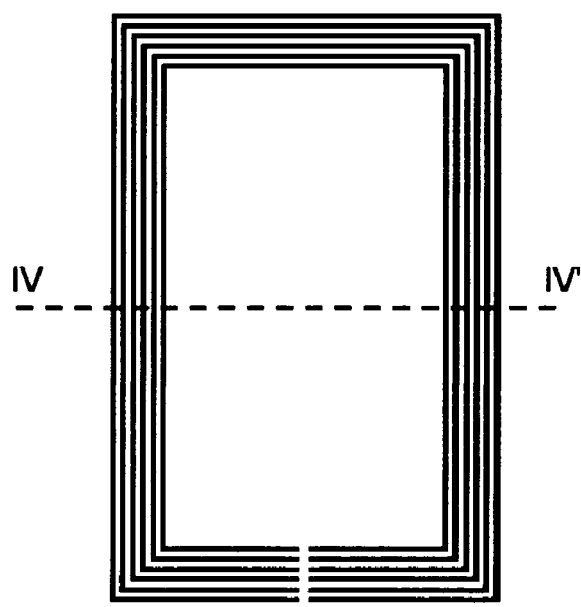
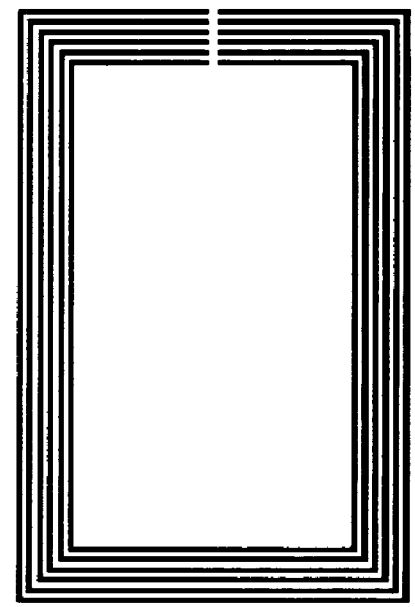
Fig. 4a            Fig. 4b
Fig. 4c            Prior Art
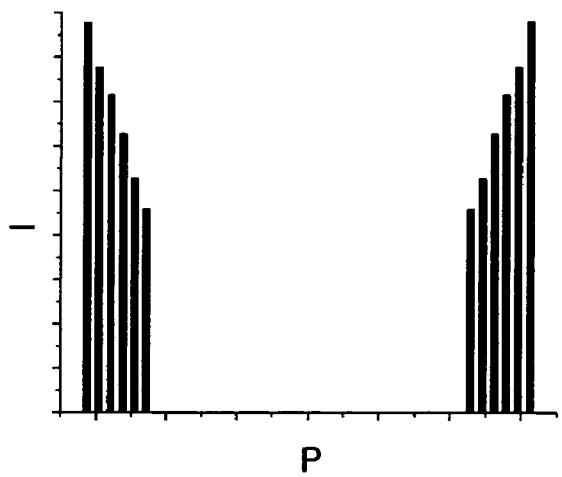

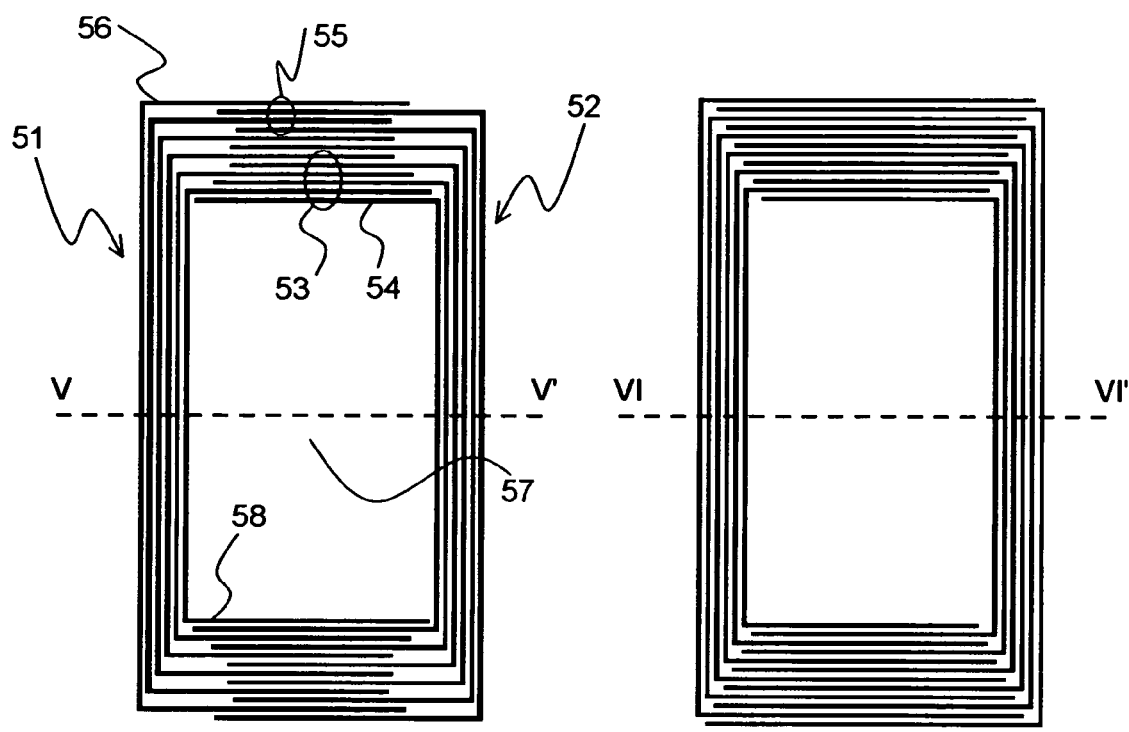
Fig. 5a
Fig. 6a
Prior Art
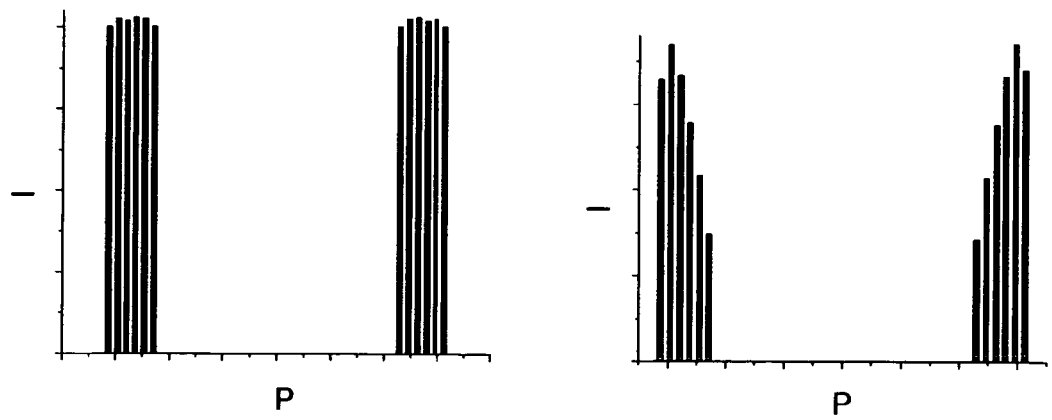
Fig. 5b
Fig. 6b

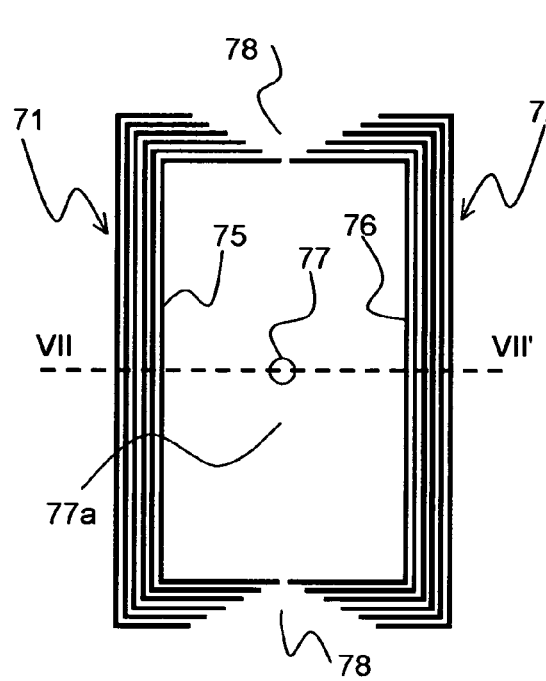
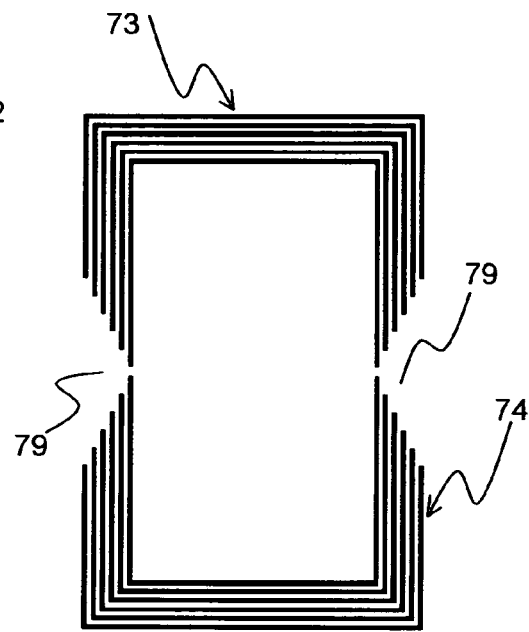
Fig. 7a
Fig. 7b
Fig. 7c
Fig. 7d
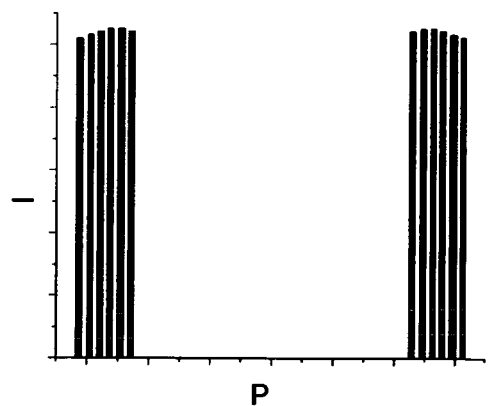
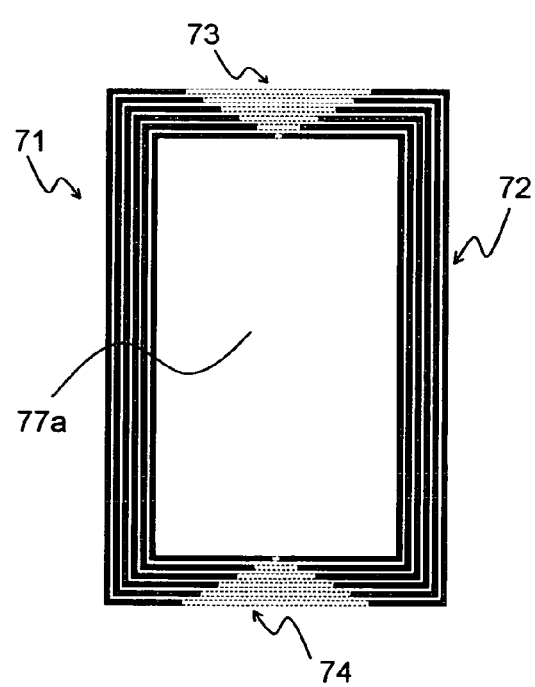

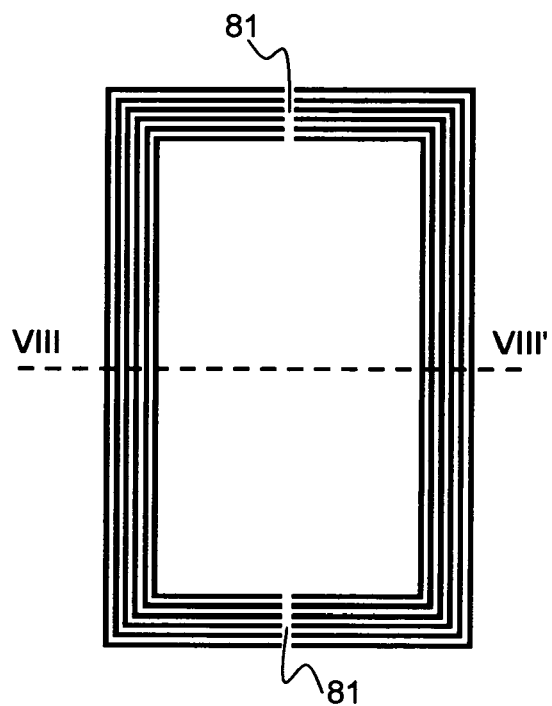
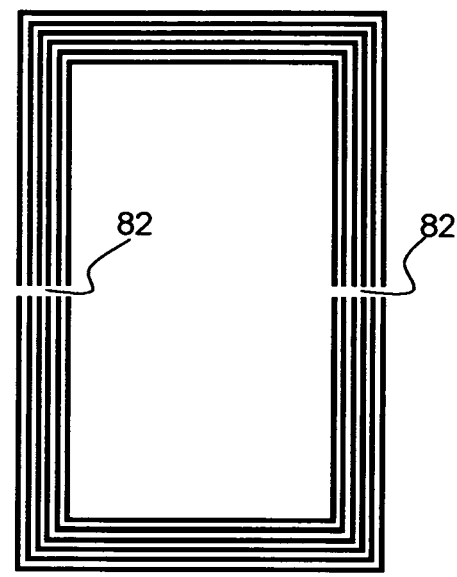
Fig. 8a          Fig. 8b
Fig. 8c          Prior Art
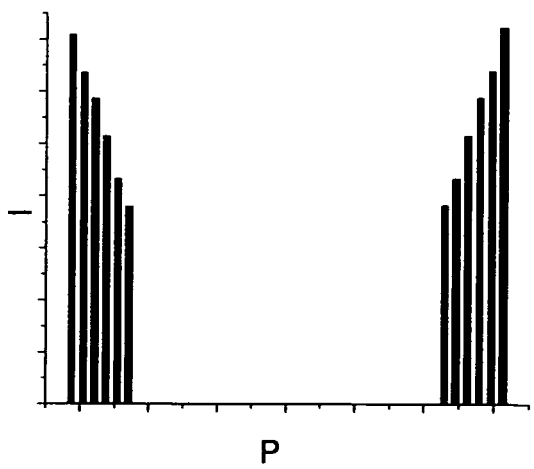

RADIO FREQUENCY RESONATOR SYSTEM WITH OPTIMIZED CURRENT DISTRIBUTION IN THE CONDUCTING ELEMENTS

This application claims Paris Convention priority of DE 10 2004 020 167.6 filed on Apr. 24, 2004 the entire disclosure of which is hereby incorporated by reference.

BACKGROUND OF THE INVENTION

The invention concerns a radio frequency (RF) resonator system, in particular, for an NMR (nuclear magnetic resonance) probe head, comprising at least one RF resonator which has at least three continuous conducting elements which form at least one window in the RF resonator, wherein only part of the conducting elements delimits the at least one window, wherein the conducting elements are coupled to each other via electromagnetic fields, and each conducting element has a limiting current density which is caused by the material, is position-dependent along the conducting element, and must not be exceeded during operation.

Radio frequency resonator systems of this type are disclosed, e.g. in U.S. Pat. No. 5,276,398 (corresponding to reference literature [8]).

Nuclear magnetic resonance (NMR) methods are used to analyse sample compositions or to determine the structure of substances in samples. In these NMR methods, the sample is exposed to a strong static magnetic field. Transverse radio-frequency electromagnetic pulses are irradiated into the sample causing interaction with the nuclear spins of the sample material. The time dependence of these sample nuclear spins generates radio-frequency electromagnetic fields which are detected in the NMR apparatus. The detected radio frequency (RF) fields provide information about the properties of the sample.

RF resonator systems are used to irradiate RF pulses into the sample and also to detect radio-frequency electromagnetic fields from the sample. An RF resonator system comprises one or more RF resonators. The at least one RF resonator is disposed in the direct vicinity of the sample for NMR measurement. The RF resonator system is galvanically, capacitively or inductively coupled to a transmitting or receiving electronics in the NMR apparatus.

Each RF resonator typically comprises several continuous conducting elements which are electromagnetically coupled, i.e. a current flow in one of the conducting elements is accompanied by a current flow in the other conducting elements via electromagnetic coupling. All conducting elements together represent an RF resonant circuit whose resonant frequency is adapted to the NMR experiment (in particular the static magnetic field strength).

To be able to detect NMR signals with minimum noise, NMR ressonators elements are conventionally produced from high-temperature superconducting (HTS) material. Such RF resonators are described in documents [1] to [10]. One disadvantage of these HTS resonators is that the maximum manageable transverse RF magnetic field strength (B1 field strength) of these RF resonators is limited by the critical current density $j_c$ of the HTS material. The larger the manageable RF magnetic field strength in the RF resonators, the shorter may be the RF pulses used by the NMR apparatus and the greater the excitation bandwidth.

It is therefore the underlying purpose of the present invention to present RF resonator systems which permit maximum transverse RF magnetic field strengths and also have a largely quadratic dependence between irradiated power and magnetic field increase in the RF resonator, i.e. the resonator is operated in a linear region of the resistance characteristic.

SUMMARY OF THE INVENTION

This object is achieved in accordance with the invention with an RF resonator system of the above-mentioned type in that the eigen-resonances of the individual conducting elements and/or the electromagnetic coupling between the conducting elements are selected such that, upon excitation of the RF resonator system, the maximum values of the quotient values along the individual conducting elements are substantially the same for all conducting elements, wherein these quotient values are defined as the quotient between the average current density which occurs in a cross-section of the conducting elements and the respective local limiting current density, or that peak-shaped current excesses which may occur mainly in the edge region of conducting element packets, in particular, at the edge of the at least one window, along individual conducting elements or along conductor groups of several conducting elements, are substantially eliminated.

In accordance with the present invention, the current distribution in the individual conducting elements of an RF resonator is adjusted by specifically selecting the couplings between the individual conducting elements of the RF resonator. The couplings can be adjusted, in particular, through selection of the length of overlapping conductor sections, extending conducting elements e.g. through meandering sections, changing the separation between conducting elements, and/or changing the cross-section of conducting elements. A simulation program may be used which solves Maxwells' equations and subsequently iteratively changes the geometry of the conducting elements to obtain a suitable RF resonator geometry with a certain current distribution in an RF resonator.

Conventional RF resonator systems merely consider the setting of the desired resonance frequency of an overall RF resonator or RF resonator system when the individual conducting elements are assembled. This produces strong relative differences in the current densities in the various conducting elements during operation. Conducting elements having a high relative current density quickly reach the region of their limiting current density in case of high RF magnetic field strength. The limiting current density may be given by the critical current density $j_c$ for a superconducting conducting element, by transition into non-linear resistance, or by a melting temperature obtained with predetermined cooling through ohmic heating or diffusion activation of a normally-conducting conducting element. If a conducting element in the RF resonator reaches the limiting current density, this conducting element will typically fail and the coupling behavior in the RF resonator changes. The resonance frequency of the RF resonator is generally detuned and the RF resonator could be irreversibly destroyed. Most of the other conducting elements thereby remain far below their respective limiting current density.

RF resonators of the inventive design have one of two current distribution variants:

In the first variant in accordance with the invention, which is preferably used for resonators on planar substrates, the current flow in each conducting element is adjusted in correspondence with the current carrying capacity of this conducting element thereby maximizing the current carrying capacity of the overall RF resonator. The maximum average current densities within the conducting elements are adjusted during operation such that the individual conducting elements uniformly approach their respective limiting current density with increasing RF magnetic field strength. This permits utilization of the full current carrying capacity of all conducting elements.

In the second variant in accordance with the invention, which is to be used mainly for Birdcage resonators, a certain relative current distribution is provided in the RF resonator in the individual conducting elements during operation (desired current distribution) i.e. an approximately sinusoidal current distribution. This desired current distribution has a desired current maximum, approximately at the sine maximum of $\pi/2$. In prior art, current flow occurs mainly in the edge region and at the windows of RF resonators, or more generally, in the edge region of spatially separated groups of associated conducting elements (packets) within an RF resonator and in individual conducting elements or groups of conducting elements, which are far above the current flow of the conducting elements of the desired current maximum. These edge conducting elements reach their limiting current density at considerably lower RF magnetic field strengths than the conducting elements in the region of the desired current maximum thereby unnecessarily limiting the efficiency of the RF resonator. In accordance with the invention, the conducting elements are designed such that the current flow in all conducting elements is never larger than in the desired current maximum. In particular, adjustment of a "quasi continuous" or smooth current distribution relative to neighboring conducting elements is possible. This is obtained e.g. through reduction of the capacitive coupling between the relevant edge conducting elements and the ring of the Birdcage resonator thereby obtaining smaller current feed. An inventive resonator can utilize the full current carrying capacity of the conducting elements in the region of the desired current maximum. In the general case of conducting elements having different geometrical shapes and/or different limiting current densities in the individual conducting elements, in the second variant in accordance with the invention, the maximum value of the quotient values of each conducting element is smaller than or equal to the maximum value in that conducting element having the largest maximum value of the quotient values in accordance with the desired current distribution.

Both variants prevent failure (e.g. quench) of individual conducting elements at relatively low RF magnetic field strengths below the actual performance limit of the RF resonator.

The following is a brief explanation of the determination of the maximum value of the quotient values of a conducting element. In a conducting element, a first cross-section is observed at a first location (relative to the z coordinate along the conducting element) during operation. Spatially distributed current flows in a perpendicular direction through this cross-section, i.e. there are spatially varying local current densities $j(x,y)$ (with x,y:coordinates perpendicular to z). The current densities are determined for the maximum amplitude of the observed alternating current, i.e. the time dependence of the observed alternating current within one period is neglected. The local current densities are then integrated over the cross-sectional surface thereby determining an average current density in the cross-section. The location (relative to z) of the cross-section has a local limiting current density. (A z-dependent limiting current density can result in a curved conducting element, e.g. due to anisotropy relative to the static magnetic field). The quotient between the average current density and the limiting current density defines the quotient value at the location of the cross-section. In the same manner, quotient values are formed for all locations (as a function of z) along the conducting element. The highest quotient value is designated as maximum value of the quotient values of the conducting element. Generally, the maximum quotient value is found in the region of a symmetry center, in particular, in the center of a conducting element.

In a simple case, all conducting elements have an identical cross-section and a uniform, spatially constant limiting current density. The maximum values of the quotient values in the conducting elements are then proportional to the maximum currents in the conducting elements.

The maximum values of the quotient values are substantially the same within the scope of the present invention, in particular, if the deviation of each maximum value from the average value of the maximum values of the individual conducting elements is maximally 25%, preferably maximally 10%.

In accordance with the invention, the maximum values of the quotient values along the individual conducting elements are moreover substantially equal if the average value of the maximum values of the quotient values is at least 75%, preferably at least 90% of the maximum value of the quotient values of that conducting element having the largest maximum value of the quotient values of all conducting elements. In this case, the entire current carrying capacity of the RF resonator is utilized by at least 75% or 90%.

In accordance with the invention, at least 75%, preferably 90% of the conducting elements have substantially equal maximum values for the quotient values and the remaining 25%, preferably 10% of the conducting elements have smaller maximum values for the quotient values. In this case, the remaining conducting elements only slightly reduce the current carrying capability of the inventive resonator system.

Only individual resonators or components which can provide a considerable absolute contribution to the B1 field are regarded as conducting elements in the present invention. In particular, galvanically insulated plates which merely serve for macroscopic homogenisation of the conducting material and carry only a comparatively small current, are not regarded as conducting elements as defined by this invention.

One embodiment of the inventive RF resonator system is particularly preferred, with which the conducting elements are produced from superconducting material, in particular, NbTi or $Nb_3Sn$. Superconducting elements can carry RF currents with little loss such that the RF resonator system achieves particularly high resonator Q-values and NMR signals can be detected with a high signal-to-noise ratio.

In a further development of this embodiment having similar but more distinct advantages, the conducting elements are made from a high-temperature superconducting material (e.g. $Ti_2Ba_2CaCu_2O_8$, $YBa_2Cu_3O_{7-x}$, $(Ti,Pb)Sr_2Ca_2Cu_3O_9$, BiPbSrCaCuO, BiSrCaCuO, BiSrCuO or BiSrYCuO) with a transition temperature>30K.

In an advantageous embodiment, the conducting elements are disposed on a flat, polyhedral or cylindrical dielectric substrate. The substrate mechanically stabilizes the resonator and can influence, as a dielectric, the coupling between the conducting elements. Moreover, the substrate permits dissipation of heat, in particular, with normally conducting elements, or cooling of superconducting elements below the transition temperature of the superconducting material. In accordance with the invention, the upper and lower sides of a substrate may be provided with conducting elements. Two substrates, each having conducting elements, may also be mounted and/or glued to each other.

In a preferred embodiment of the inventive RF resonator system, the conducting elements have an approximately rectangular cross-section, in particular, with a thickness of between 200 nm and 1 µm and/or a width of between 2 µm and 50 µm. The rectangular cross-section is easy to produce and the computer-assisted determination of inventive geometries for conducting elements is particularly simple with this basic shape.

In one particularly advantageous embodiment, the limiting current densities are equal in all conducting elements of an RF resonator. This may be obtained e.g. through a suitable, uniform, isotropic material for all conducting elements.

In one advantageous further embodiment, the conducting elements of an RF resonator each have identical cross-sections at the location of their respective maximum quotient values. In this case, the average current density in each conducting element at the location of the maximum quotient value is proportional to the current flow there, thereby facilitating determination of an inventive geometry of conducting elements.

In one particularly preferred embodiment, one or more conducting elements have a meandering section, which is, in particular, disposed in the region of the base of a U-shaped conducting element. Meandering sections permit the precise change of the inductance of substantially one single conducting element, or the standing wave properties, and therefore of its resonance frequency.

In another particularly preferred embodiment, various conducting pairs have different capacitive overlapping. Conducting pairs are formed by neighboring conducting elements. Adjustment of the overlapping lengths at parallel sections of the conducting elements with fixed separation permits precise setting of the capacitive coupling between these conducting elements. Such overlapping may also be generated in the two end regions of one single conducting element (FIG. 1a E), or be distributed over the entire length of an element (FIG. 1a; F and G).

In one particularly preferred embodiment, the ratio between the width of the conducting element and the separation from neighboring conducting elements is different for different conducting pairs in the region of overlappings. In accordance with the invention, the width and separation of the conducting elements can also be differently adjusted independently of each other in different conductor pairs. These geometries permit precise adjustment of the coupling between the conducting elements.

A further inventive RF resonator system is characterized in that the RF resonator has four sets of nested U-shaped conducting elements, wherein the U-shaped conducting elements of each set open towards the center of the RF resonator in the same direction and within each set, the ends of the legs of further outward U-shaped conductor elements are retracted relative to the ends of the legs of U-shaped conducting elements disposed further inward, and two respective sets have U-shaped conducting element openings which face each other and are disposed in one plane, wherein the U-shaped conducting elements of the two sets of each plane do not engage one another, and wherein the opening directions of the U-shaped conducting elements of the first plane are rotated by 90° relative to the opening directions of the U-shaped conducting elements of the second plane. This RF resonator system has substantially the same maximum values of the quotient values for all conducting elements.

In an inventive design of this RF resonator system, the two planes are disposed parallel and proximate to each other, and are connected to each other through a dielectric layer.

In a further inventive RF resonator system, the RF resonator comprises two sets of U-shaped conducting elements, wherein the U-shaped conducting elements within each set are nested and open in the same direction, the opening directions of the U-shaped conducting elements of the two sets facing one another, the legs of the U-shaped conducting elements of the two sets engaging one another, wherein exactly one leg of a conducting element of a set engages in each space between two neighboring legs of conducting elements of the other set, and in an inner region which borders the window, the engagement depth of the legs of the U-shaped conducting elements into the spaces in the RF resonator decreases from the inside to the outside. This RF resonator system also comprises substantially identical maximum values of the quotient values for all conducting elements.

In one design of this RF resonator system, the engagement depth of the legs of the U-shaped conducting elements into the spaces in the RF resonator in an outer region increases again from the inside to the outside. This improves integration of the current carrying capacity in the outer region in the resonator, in particular, if there are many conducting elements per set.

One embodiment of an inventive RF resonator system is particularly preferred which comprises several RF resonators of the same design, in particular 2 or 4 RF resonators of the same design. This embodiment can be used as a simple, planar Helmholtz arrangement which has a particularly good B1 field homogeneity.

In another inventive RF resonator system, the RF resonator comprises at least one set of straight, parallel conducting elements, the conducting elements in a central region of the set having identical lengths, and further remote conducting elements in the outer regions of the set are shortened compared to the conducting elements disposed further inwards. This embodiment eliminates peak-shaped current excesses in the outer conducting elements, i.e. in the edge region of the set. A typical set is a bar of a Birdcage resonator. A set of this type also represents a packet of conducting elements as defined by the invention.

One design of this RF resonator system is characterized in that the RF resonator system is designed as Birdcage resonator, in particular, a hybrid Birdcage resonator, and comprises several sets of straight, parallel conducting elements. Current excesses at each outer side of each set are thereby eliminated and the efficiency of the Birdcage resonator is determined by the current flow of the conducting element or conducting elements at the maximum of its sinusoidal current distribution.

One embodiment of an inventive RF resonator system is also particularly preferred, with which the RF resonator system is part of an NMR probe head and comprises a sample to be measured, wherein the conducting elements are placed on one or more flat, polyhedral or cylindrical dielectric substrate(s) and the conducting elements are spatially arranged such that the RF magnetic field generated in the active volume of the sample is as homogeneous as possible. In accordance with the invention, the arrangement of the conducting elements to be determined is additionally given a further value to be optimized, i.e. the homogeneity of the transverse RF magnetic field to be generated. This may be obtained through computer-assisted calculation in that the conditions for the optimally identical current flow in each conducting element are initially set and fixed, wherein all conducting elements should have the same cross-section. The conducting elements are then placed on the substrates to obtain maximum field homogeneity under the condition that the maximum currents in all conducting elements are the same. Finally, the (in particular capacitive) couplings between the elements are adjusted such that substantially equal maximum currents actually flow in the conducting elements during operation. If this capacitive current transfer between conducting elements is localized, its influence on the field homogeneity can be neglected. Otherwise an iterative process must be carried out. To homogenize the field, the current flow in the outer region must generally be higher than in the inner region such that the conducting density in the RF resonators in accordance with the invention increases towards the outside.

In one advantageous embodiment, the neighboring conducting elements are galvanically interconnected at locations having the same electric potential. The galvanic connection may preferably be provided at the symmetry points of the conducting elements. The connecting points may also be used to couple to or decouple from an RF resonator.

In one embodiment, all conducting elements have a rectangular cross-section of uniform width and uniform height, wherein the width and height extend perpendicularly to the main flow direction of the conducting elements. The production and calculation of this embodiment is particularly easy.

A preferred embodiment, in particular, for RF resonator systems of superconductors, contains plates carrying no or only small currents. These plates may be placed, in particular, to obtain a macroscopically homogeneous distribution of the conducting material.

In one advantageous embodiment of the inventive RF resonator system, the RF resonator comprises at least 10 conducting elements, preferably at least 20 conducting elements. In this case, the inventive teaching obtains particularly good efficiency for the RF resonator system.

In one preferred embodiment, at least some conducting elements have different eigen-resonances. In this case, the conducting elements can be arranged with particularly great freedom.

In one preferred embodiment, the conducting elements of the RF resonator are nested only and not intertwined. Nested means that conducting elements which are disposed further inside, are located completely within a region enclosed by conducting elements disposed further outside. In other words, the resonator has a sequence of conducting elements while moving away from a window from the inside to the outside. In case of intertwining, one section of a first conducting element is disposed between two sections of a second conducting element, wherein one section of the second conducting element in the resonator is further outside and one further inside than the section of the first conducting element. Nesting facilitates adjustment of the current distribution in the conducting elements and therefore in the resonator.

In one preferred embodiment, the conducting elements are exclusively the linear basic type and/or the U-shaped basic type and/or the open annular basic type. These basic types are particularly simple to produce and integrate in an inventive RF resonator system. The conducting elements of these basic types may thereby comprise modifications such as meandering sections. Alternatively or additionally, the RF resonator of an inventive RF resonator system may be free from conducting elements of the spiral basic type. The use of simple, in particular, non-spiral conducting elements improves current utilization of the conducting elements.

The present invention also includes a method for designing an inventive RF resonator system with homogeneous current utilization, comprising the following steps:
1. designing an arbitrary RF resonator system, in particular, according to prior art, preferably according to [1–8];
2. Calculation of the current distribution in the RF resonator system for the desired resonance mode;
3. calculation of the maximum values $Q_i$ of the quotient values along the individual conducting elements i;
4. correction of the eigen-resonances of the individual conducting elements and/or electromagnetic coupling through adjustment of the lengths, and/or the ratio between separation and width of the capacitive overlappings between neighboring conducting elements, and/or through replacement of straight conducting sections with meandering sections, wherein these changes are carried out in dependence on the respective deviation of the value $Q_i$, calculated in step 3, from a constant reference value, wherein the reference value is preferably equal to the minimum, maximum or average value of the $Q_i$ values calculated in step 3.
5. repeating steps 2 through 4 until all values $Q_i$ are substantially equal to the selected reference value.

The present invention also includes a method for designing an inventive RF resonator system without peak-shaped current excesses, comprising the following steps:
1. designing an RF resonator system, in particular, according to prior art, preferably according to [9–10];
2. Calculation of the current distribution in the RF resonator system for the desired resonance mode;
3. calculation of the maximum values $Q_i$ of the quotient values along the individual conducting elements i;
4. selection of the conducting elements k in the edge regions with peak-shaped current excesses whose maximum values of the quotient values are equal to $Q_k$;
5. correction of the eigen-resonances of the individual conducting elements k and/or electromagnetic coupling through adjustment of the lengths, and/or the ratio between separation and width of the capacitive overlappings between neighboring conducting elements and/or through replacement of straight conducting sections through meandering sections, wherein these changes are carried out in dependence on the respective deviation of the value $Q_k$ calculated in step 3 from a reference value, wherein the reference value is smaller than the maximum $Q_i$ value outside of the selected edge regions.
6. repeating steps 2 through 5 until all values $Q_k$ are smaller or equal to the selected reference value.

Further advantages of the invention can be extracted from the description and the drawing. The features mentioned above and below can be used in accordance with the invention either individually or collectively in arbitrary combination. The embodiments shown and described are not to be understood as exhaustive enumeration but have exemplary character for describing the invention.

The invention is shown in the drawing and explained in more detail with reference to embodiments.

BRIEF DESCRIPTION OF THE DRAWING

FIG. 1b shows examples of RF resonators which are composed of the basic types of conducting elements in accordance with FIG. 1a;

FIG. 2a shows an RF resonator with distributed capacitances in accordance with prior art;

FIG. 2b shows the current distribution in the RF resonator in accordance with FIG. 2a in the sectional plane II–II';

FIG. 3a shows an RF resonator with distributed capacitances with three fingerlets per finger in accordance with prior art;

FIG. 3b shows the current distribution in the RF resonator in accordance with FIG. 3a in the sectional plane III–III';

FIG. 4a-4b show the upper side and lower side of an RF resonator on a substrate which is coated on both sides, in accordance with prior art;

FIG. 4c shows the current distribution at the upper side of the RF resonator of FIG. 4a/4b in the sectional plane IV–IV';

FIG. 5a shows an inventive RF resonator on the basis of nested U-shaped conducting elements with reduced overlapping in a central region;

FIG. 5b shows the current distribution in the inventive RF resonator in accordance with FIG. 5a along the sectional plane V–V';

FIG. 6a shows a conventional RF resonator on the basis of nested U-shaped conducting elements with an overlapping region which uniformly increases towards the outside;

FIG. 6b shows the current distribution in the inventive RF resonator in accordance with FIG. 6a along the sectional plane VI–VI';

FIG. 7a-7b show the upper and lower sides of an inventive RF resonator on a substrate which is coated on both sides with V-shaped interrupted regions, between U-shaped conducting elements, which are open to the outside;

FIG. 7c shows the current distribution in the inventive RF resonator in accordance with FIG. 7a/7b along the sectional plane VII–VII';

FIG. 7d shows a superposed illustration of the upper and lower sides of the inventive RF resonator of FIG. 7a/7b to illustrate the window;

FIG. 8a-8b show upper and lower sides of an RF resonator on a substrate which is coated on both sides with rectangular interrupted regions between U-shaped conducting elements, in accordance with prior art;

FIG. 8c shows the current distribution in the RF resonator in accordance with FIG. 8a/8b along the sectional plane VIII–VIII';

DESCRIPTION OF THE PREFERRED EMBODIMENT

Currently either Helmholtz/Birdcage coils of normal metal or in case superconducting material is used, planar Helmholtz coils or hybrid Birdcage resonators are used in the field of nuclear magnetic resonance (NMR) probe heads.

Planar Helmholtz coils have hitherto been composed of an even number of planar resonators, thereby using the following resonator types:
1. spirals (compare basic type "e" in FIG. 1b) [1,7,8]
2. coils with distributed capacitances (compare basic type "c" in FIG. 1b) [3, 4]
3. coils with localized capacitances (compare basic types "a", "b", "d" in FIG. 1b) [2, 3, 4]

The first resonator type has relatively low resonance frequencies. A variant with higher resonance frequency is described in [1]. The second resonator type has high resonance frequencies, and the third resonator type can carry the maximum current in the z direction, in contrast to the second, since the decrease in localized capacitances occurs at the top and bottom, where, on the average, only half the current flows per conductor path.

Each of these resonator types can be described as being composed of a number N (N≧1) of conducting elements. A conducting element as defined herein, is a connected part of a conductor path which may also be regarded as a resonator. Each of these conducting elements has a certain resonance frequency $f_i$ which is given by the distributed capacitances (e.g. for elements of type E) and inductances or with missing or very low capacitive coupling between the two end regions of the element (e.g. for elements of type A, B, C, D and also F and G) in view of the standing wave along the length of the element.

Assembly of the conducting elements to form an RF resonator produces a plurality of modes for the overall resonator. The resonance frequencies of this overall resonator are thereby given by the resonance frequencies of the individual conducting elements and (inductive and capacitive) couplings between the conducting elements.

Figure 1A:
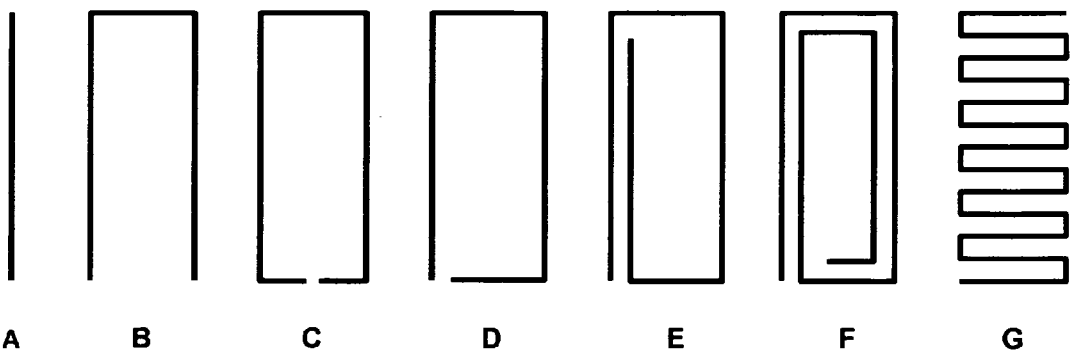
FIG. 1a shows examples of basic types of conducting elements (not complete)
Figure 1B:
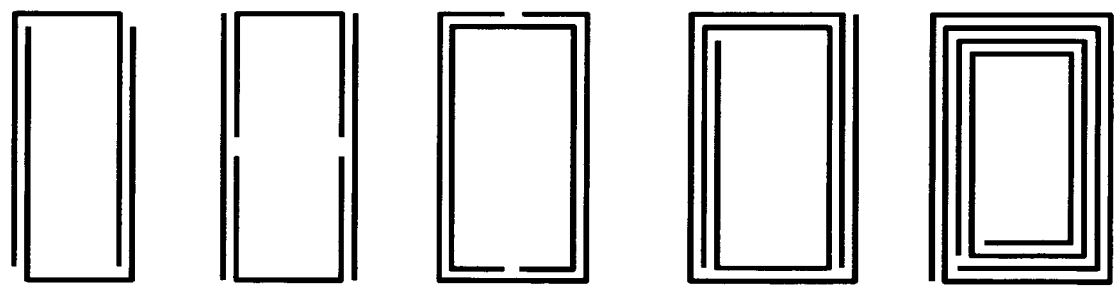

FIG. 1a shows, as an example, various basic types of conducting elements (basic elements). Conventionally, mainly conducting elements of the basic types with straight line A, U-shaped B, open rings C, D and spiral F are used. The meandering shape G is a basic type of the present invention. The basic elements may be assembled as is exemplarily shown in FIG. 1b, e.g. (B+B) or (2A+2B) or (E+E) etc. Any type of scaling and rotation of all basic elements and rounding of corners and of straight sections is thereby possible.

The conducting elements are conventionally assembled with one single boundary condition: The basic frequency of the resulting resonator must be specifically set.

Within the scope of the invention it has turned out that there are two further boundary conditions which are important for NMR coils and, in particular, HTS coils on planar and polyhedral substrates.

1. the maximum currents in each conducting element;
2. the homogeneity of the resulting B1 field.

A superconductor carries current with little resistance only up to the critical current density $j_c$. NMR coils should generate transverse B fields with maximum strength to permit pulses of minimum length. It is therefore important that the resonator has the maximum possible current. This means that all conducting elements should carry the same maximum current (this applies, however, under the simplifying assumption of identical current carrying capacity for all conducting elements. If there are different current carrying capacities in different conducting elements, the quotient of maximum current in the conducting element and the current carrying capacity of the conducting element should be substantially the same for all conducting elements. If the current carrying capacities along one single conducting element are variable, the maximum values of the quotient values must be adjusted accordingly, as outlined above). If individual conducting elements carry a higher maximum current than the critical current, the superconductor will quench locally. The resonance frequency of the overall resonator is thereby detuned and RF adjustment is considerably deteriorated which prevents the flow of high currents in the resonator. This can occur even at currents far below a quench, if the RF resistance of the superconductor starts to increase (non-linear I-V curve/resistance curve of the superconductor). In this case, the current density which, when exceeded, causes non-linearities, is taken as limiting current density. Considerably lower voltages are moreover applied to the capacities of the resonator if the same transverse B field strength is generated with a resonator with optimized current distribution instead of a resonator with considerably higher currents in the individual conducting elements. This can also prevent voltage breakdowns.

Tailoring to the maximum current in the conducting element is effected in view of the fact that the current maximum and voltage maximum of different strengths alternate within a conducting element. The global current maximum in the conducting element is used to determine the maximum possible current in a conducting element (if the current carrying capacity also varies along a conducting element, the maximum quotient value between the current, i.e. average current density, and current carrying capacity, i.e. limiting current density is to be used for each conducting element and adjusted to a substantially equal value, as discussed above).

The resonators realized in accordance with prior art (FIG. 2a to 4c) do not have homogeneous current distributions. FIG. 2a shows an example of a resonator with distributed capacitances which is composed of a plurality of resonators (conducting elements) 21 of the type C of FIG. 1a. FIG. 2b shows the maximum current which flows through the individual conducting elements, and is shown in the sectional plane II–II' of FIG. 2a. The maximum value of the amount (maximum amplitude) of alternating current flow "I" in a cut conductor path is plotted in the vertical direction in arbitrary units (the horizontal axis is the zero line). The position "P" of the respective conductor path on the sectional plane II–II' is plotted along the horizontal axis. The current flows mainly on the outer side of the resonator. If the overall current increases, the outer conducting elements will quench while the inner conductor paths still remain far below their current carrying capacity.

If each finger 22 is subdivided into "fingerlets" 23a–23c (FIG. 3a), current flows mainly on the two outermost fingerlets of one finger (FIG. 3b) and the sectional current distribution through the resonator has a strong maximum towards the outside (to facilitate illustration, the sections are always on a symmetry axis where maximum currents occur). The maximum current which can be carried through the resonator thereby decreases compared to the embodiment of FIG. 2a. "Fingerlets" of a finger is defined as similar, parallel, neighboring conducting elements. A group of "fingerlets" constitutes one finger.

A variant of a resonator with distributed capacitances is given by a coil on a substrate which is coated on both sides, and shows a similar behavior as the resonator of FIG. 2a. FIG. 4a and FIG. 4b show upper and lower sides of a substrate which is coated on both sides with HTS material (or two substrates which are disposed on top of each other via a dielectric). The current flow extends again mainly in the outer region (FIG. 4c). The inner conducting elements are not fully utilized.

In a first variant of the invention, the current is distributed in the resonator through adjustment of the conducting elements and their couplings, such that the current distribution is homogeneous, i.e. the maximum currents in all conducting elements are equal, and optionally, by defining the current distribution in the resonator such that the magnetic field B1 produced thereby is as homogeneous as possible. A combination of both solutions produces equal distribution of the maximum currents with a geometric distribution of the conducting elements which optimizes the homogeneity of the generated RF field in the region of the NMR sample.

An RF resonator composed of the basic elements actually consists of a large number of capacitively and inductively coupled individual resonators (conducting elements).

The current distribution may be set as desired by adjusting the eigen-frequencies of the individual resonators (through adjustment of the standing wave properties or inductances and capacitive coupling between the end regions of the conducting elements) and the capacitive and inductive couplings between the individual resonators. Of these methods, in particular, that (preferred) method shall be illustrated which mainly changes the capacitive couplings in order to e.g. homogeneously distribute the current.

In this connection, FIGS. 5a and 6a each show RF resonators on the basis of nested U-shaped conducting elements. The inventive embodiment of a resonator of FIG. 5a shows two sets 51, 52 of U-shaped conducting elements. The conducting elements of each set 51, 52 are parallel to each other. The legs of the conducting elements of the two sets 51, 52 face each other and engage one another such that a leg of one set each engages between two legs of the other set, except for the inner and outer edges. Part of the conducting elements, namely the conducting elements 54 and 58 at the inner edge of the resonator delimit a window 57 disposed in the center of the resonator. In an inner region 53 of the conducting elements which extends from the innermost conducting element 54 over several conducting elements in an outward direction, the mutual engagement depth of the conducting elements decreases from the inside to the outside. In an outer region 55 which extends from an outermost conducting element 56 over several conducting elements towards the inside, the mutual engagement depth decreases from the outside to the inside. In FIG. 6*a* showing prior art, the legs of the U-shaped conducting elements extend between the surrounding legs in accordance with the available space, substantially up to the respective facing base. In other embodiments of prior art, all legs have the same length [2–8].

The inventive embodiment of FIG. 5*a* has conducting element legs having a certain length to even out the current flow in the conducting elements. FIG. 5*b* shows the current flow through the conductor paths in the central sectional plane V–V', where the maximum currents in each conducting element occur. All current strength values in FIG. 5*b* are the same within a deviation of approximately 5%. In prior art of FIG. 6*a*, the maximum currents in each case are shown in the symmetry plane VI–VI'. The associated current distribution (FIG. 6*b*) shows a maximum at the second outermost conducting element and a strong decrease of the maximum currents towards the innermost conducting elements. The innermost conducting element thereby has a current strength value of approximately 40% of the maximum current strength value of the second outermost conducting element.

Conducting elements with insufficient current flow in the conventional embodiment of FIG. 6*b* have, due to this deficit, roughly proportionally longer legs or engagement depth (corresponding to the larger capacitive coupling) in the embodiment of FIG. 5*a* than the second outermost conducting element which had a maximum current flow in FIG. 6*b*.

This principle also functions in other types of resonators. A double-sided resonator is shown as further example (sum of the currents on both sides is always constant)—in FIG. 7*a* through 7*c* in accordance with the invention and in FIG. 8*a* through 8*c* in accordance with prior art.

Figure 15A:
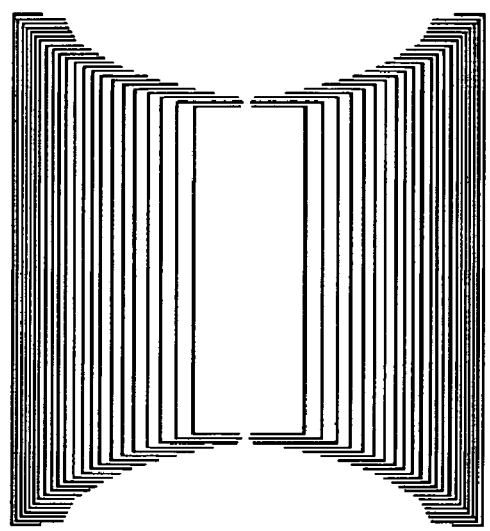
FIG. 15a-15b show inventive RF resonators on the basis of nested U-shaped conducting elements with a separation between the conducting elements which decreases to the outside to improve the field homogeneity.
Figure 15B:
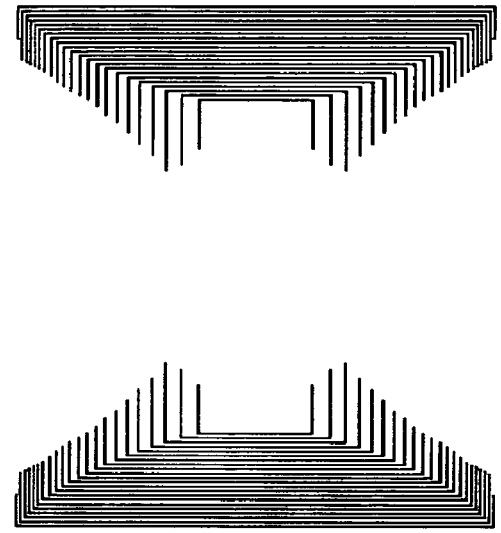
Figure 15C:
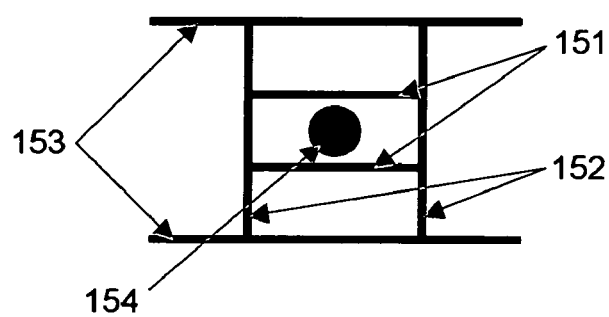
FIG. 15c shows an arrangement of planar resonators with the inventive design in accordance with FIG. 15a/15b.

The resonator in accordance with the invention (FIG. 7*a*, 7*b*) comprises four sets 71–74 of U-shaped conducting elements with parallel orientation within one set, wherein the sets 71, 72 are disposed on the upper side of a substrate in a first plane and the sets 73, 74 are disposed on the lower side of the substrate in a second plane. The legs of the conducting elements of both sets of one plane face each other. The opening directions of the legs of the conducting elements on the upper and lower sides are mutually rotated by 90°. The innermost conducting elements 75, 76 surround and delimit a rectangular shaped window 77*a* of the resonator which is exemplarily shown for the upper side in FIG. 7*a*. The sample to be measured is disposed in the region of the window 77*a*, preferably in the region of a center 77. In a resonator system which consists of at least one resonator pair, the sample is preferably disposed in the center of the space between the at least two resonators in the region of the window (FIG. 15*c*). In each case, triangular spaces 78, 79 remain between the ends of the opposite legs of the conducting elements of a plane. The ends of legs disposed further outside are further separated in the direction of the legs than the ends of inward legs. The current distribution in the symmetry plane VII–VII', where the maximum currents occur, is shown in FIG. 7*c*. The current flow in all conducting elements is substantially equal. FIG. 7*d* shows superposition of the sets 71 through 74 in the substrate plane to illustrate the region of the window 77*a*. The sets 73, 74 of conducting elements of the lower side are only shown with broken lines and are largely covered by the sets 71, 72 of the upper side.

The separations between all opposite legs of conventional U-shaped conducting elements of one plane are the same (FIG. 8*a*, 8*b*). The associated spaces 81, 82 are therefore rectangular. The maximum current flow in the conducting elements decreases from the outside towards the inside (FIG. 8*c*).

Figure 9A:
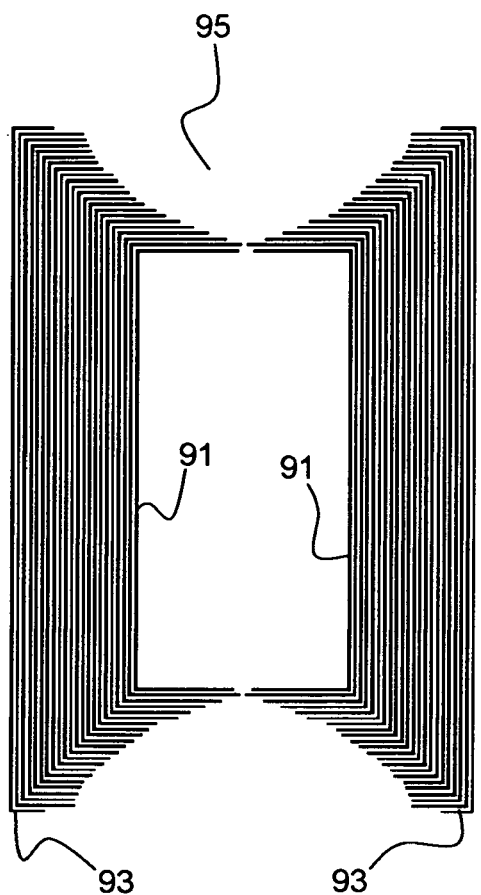
FIG. 9a-9b show the upper and lower sides of an inventive RF resonator on a substrate which is coated on both sides with U-shaped interrupted regions, between U-shaped conducting elements, which are open to the outside, wherein the innermost and outermost conducting elements are further shortened.
Figure 9B:
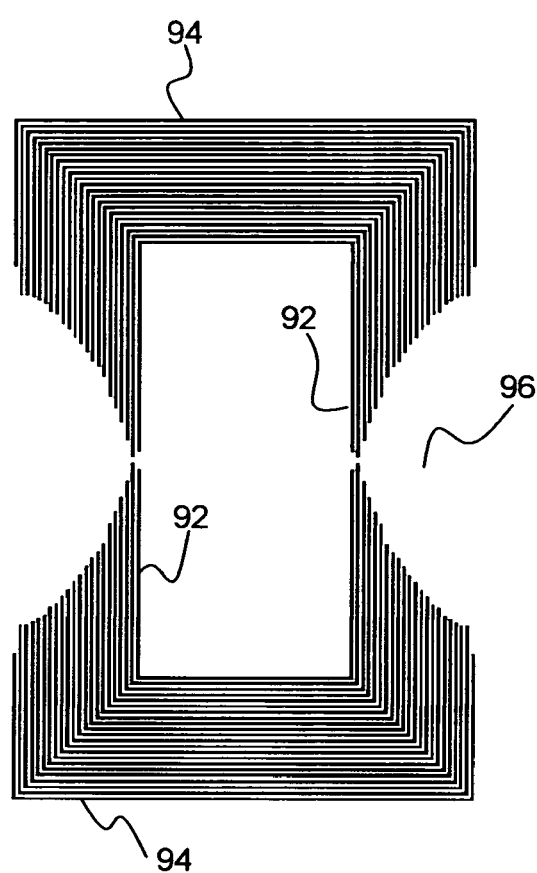

FIGS. 9*a*, 9*b* show an embodiment of an inventive RF resonator in correspondence with FIG. 7*a*, 7*b*, which comprises, however, many more conducting elements. The maximum currents are substantially equal in all conductor paths. At each edge, one conducting element is shortened to delimit the "peak-shaped current excess" as in the Birdcage (see below). The innermost conducting element 91, 92 which borders the window and the outermost conducting element 93, 94 are each effected. If more elements are provided, more than one conducting element may possibly be shortened. The spaces 95, 96 are roughly U-shaped or semi-circular.

Within the scope of the present invention, possible bends in the conducting elements, i.e. at conducting sections of a conducting element which join at right angles, may be rounded. Straight conducting element sections may also be replaced by round sections.

The method used to determine the elements is described below: A resonator or resonator system is initially designed e.g. in accordance with FIG. 8*a*/8*b*. The current distribution for the relevant resonance mode is then calculated. The corrections for the capacitive couplings are determined therefrom, i.e. the difference between a reference value and the actual maximum current density is determined and the capacitances of the conducting elements with too low a current are increased in proportion to this difference, and those of conducting elements with excessive currents are correspondingly decreased (in case of unequal conductor cross-sections or different limiting current densities, the quotient values are correspondingly used for adjustment instead of the absolute values of the currents). To obtain a homogeneous current distribution, this reference value is the same for all conducting elements. If peak-shaped current excesses are to be eliminated in the edge regions, each edge region of the conducting element can be associated with a reference value which is smaller than the global maximum value (desired current maximum) of the remaining conducting elements. The reference values may be selected such that any current distribution can be set, in particular, the desired current distribution which obtains maximum field homogeneity for a given resonator system. During adjustment of the electromagnetic couplings and eigen-resonances of the conducting elements, the resonance frequency of the observed resonance modes must remain at the correct frequency. This is approximately obtained with a homogeneous current distribution, if the average value of the maximum currents is used as reference value to adjust the current densities. Finally, the current distribution is re-calculated. Generally, less than five iterations are required to obtain less than 5% deviation from the average current in all conducting elements and to adjust the resonance frequency. The method also applies for adjustment of the inductances.

Figure 10A:
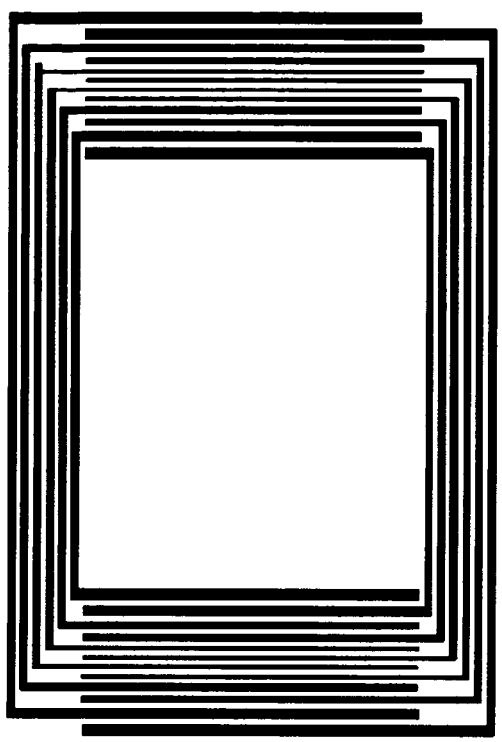
FIG. 10a shows an inventive RF resonator on the basis of nested U-shaped conducting elements, at the short sides of which the width of the conducting elements increases from a central region of the conducting elements towards the inner and outer edge of the resonator.
Figure 10B:
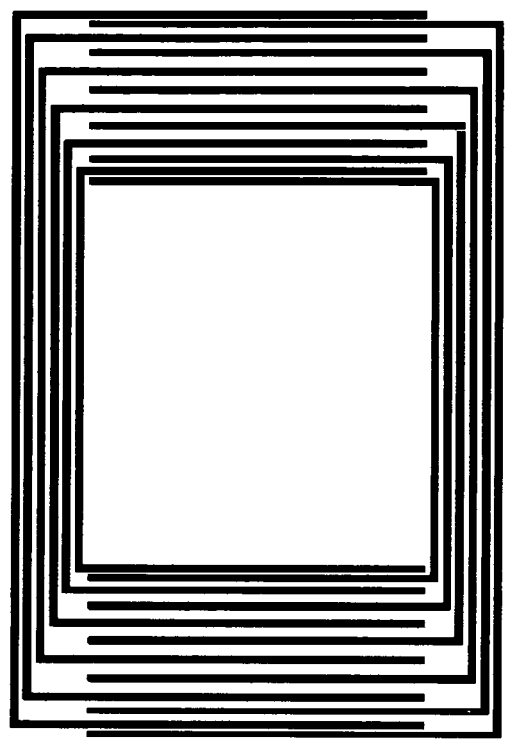
FIG. 10b shows an inventive RF resonator on the basis of nested U-shaped conducting elements, wherein, at the short sides, the separation between the conducting elements decreases from a central region of the conducting elements to the inner and outer edge.

The invention basically offers several methods to adjust the current density in a conducting element: The capacitive couplings between the conducting elements can be adjusted by changing the length of the fingers in the finger capacitors (FIG. 5a, 5b, 7a, 7b), by changing the width of the fingers for identical separation (FIG. 10a), by changing the separation for identical finger width (FIG. 10b), or through any combination of these three possibilities.

Figure 10C:
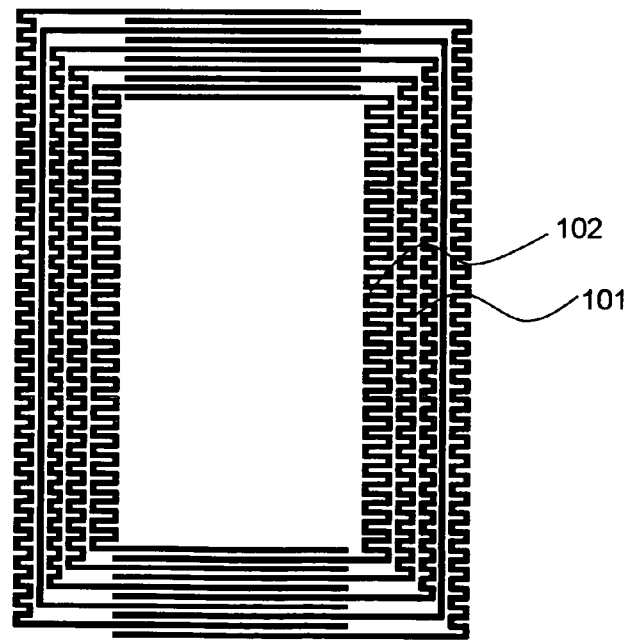
FIG. 10c shows an inventive RF resonator on the basis of nested U-shaped conducting elements, wherein part of the U-shaped conducting elements have meandering sections at their bases.

The current distribution can also be homogenized or set as desired through adjusting the inductances of the individual conductor paths. The inductance can be increased e.g. through enlarging individual loops. A further possibility to increase the inductance may be through local meandering (i.e. meandering sections 101, 102) either within the finger capacitors or outside (FIG. 10c) of the finger capacitors or a combination of both.

Figure 16A:
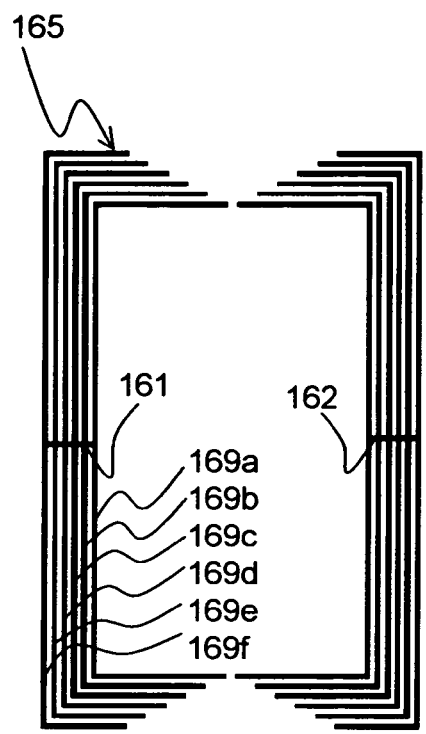
FIG. 16a-16b show the upper and lower sides of an inventive RF resonator on a substrate which is coated on both sides with V-shaped interrupted regions, which are open to the outside, between U-shaped conducting elements and with galvanic connections between the U-shaped conducting elements at symmetry planes.
Figure 16B:
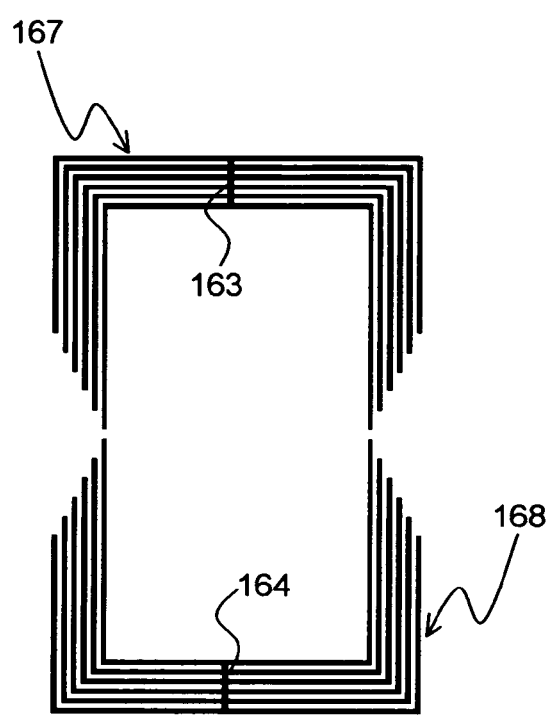

It is basically possible within the scope of the invention to galvanically connect individual conducting elements at selected points. If the current distribution should not be changed thereby, suitable connecting points are e.g. locations having the same electric potential during operation of the resonator. Such locations of the same electric potential are regularly provided on the symmetry planes of resonators. If the currents in a resonator are homogenized and the elements are galvanically connected at the locations of identical potential, the current distribution changes only slightly (depending on the width of the connection). In accordance with the invention, the resonator of FIG. 7a, 7b can e.g. comprise four connecting elements 161–164, each in the center of the sets 165–168 (FIG. 16a and FIG. 16b). The connecting element 161 connects e.g. the six conducting elements 169a–169f which are disposed next to each other.

Figure 11A:
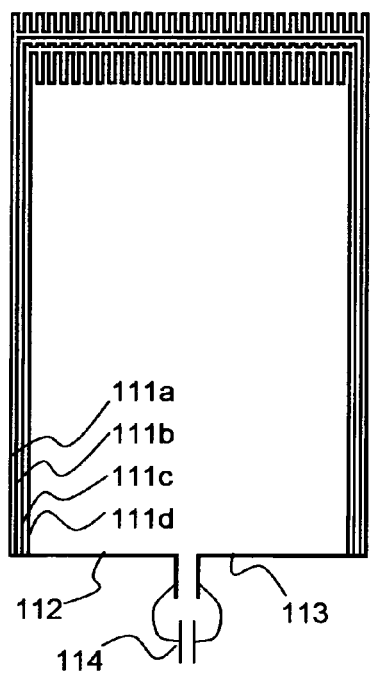
FIG. 11a-11b show inventive RF resonators with galvanic connections between individual conducting elements.
Figure 11B:
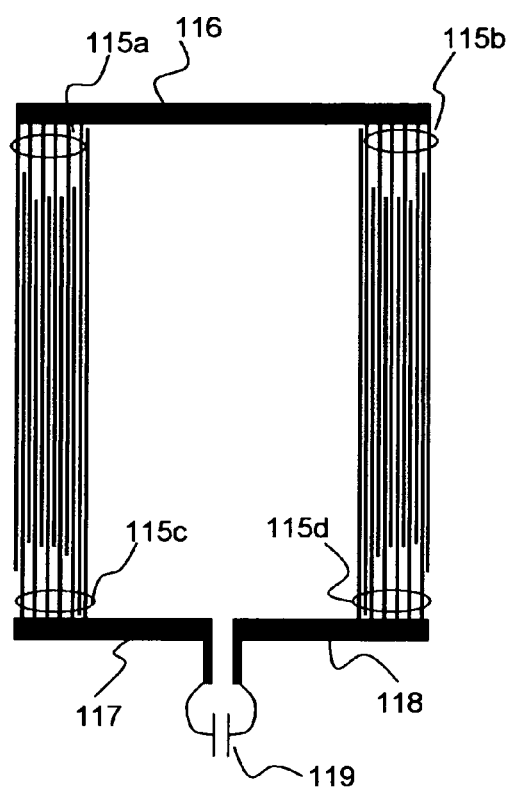

FIGS. 11a and 11b show further embodiments with galvanic connections of individual elements. These connections are not connections in symmetry planes, wherein the distribution of the currents substantially depends on galvanic coupling. The capacitances and inductances of the conducting elements and their couplings with other elements must be adjusted in this case with the additional condition of galvanic coupling.

FIG. 11a shows an inventive resonator with four conducting elements 111a–111d. The conducting element 111b is U-shaped, while the conducting elements 111a, 111c and 111d are U-shaped having meandering structures at their bases. The meandering structures adjust the current in the conducting elements 111a–111d. Meandering structures may basically also be provided alternatively or additionally at the legs. The ends of the legs on the left-hand-side of the conducting elements 111a–111d are connected to a first connecting element 112 and the ends of the legs on the right-hand side are connected to a second connecting element 113. The resonance frequency of this resonator is adjusted through a fixed or variable capacitance 114 in the form of a chip or trimmer between the elements 112, 113 which serve as connecting legs. The current distribution is thereby largely homogeneous over a wide frequency range.

FIG. 11b shows an inventive resonator with a total of 24 conducting elements. The ends of the sets 115a and 115b of conducting elements are connected to a connecting element 116. The set 115c is connected to a connecting element 117 and the set 115d is connected to a connecting element 118. A capacitance 119 which is designed as chip or trimmer is also installed between the connecting elements 117 and 118 to adjust the resonance frequency of the resonator. The currents are thereby homogenized over a certain range of the capacitance 119 (frequency range of the resonator). The currents in the individual legs are adjusted through capacitive adjustment. To facilitate the simulation calculation, only the lengths were adjusted instead of adjusting the ratio between conductor path width and conductor path separation. The sets of conducting elements on the left, 115a/c and right 115b/d were connected at the top and bottom, but this is not absolutely necessary. Connection may be provided only at the connecting leg of the capacitance 119 using the connecting elements 117, 118 and the conductor paths at the top may be configured without galvanic connection. In this case, however, the couplings between the conducting elements have to be readjusted.

The invention can also be applied to other coil types: e.g. to the hybrid coil of [9].

Figure 12A:
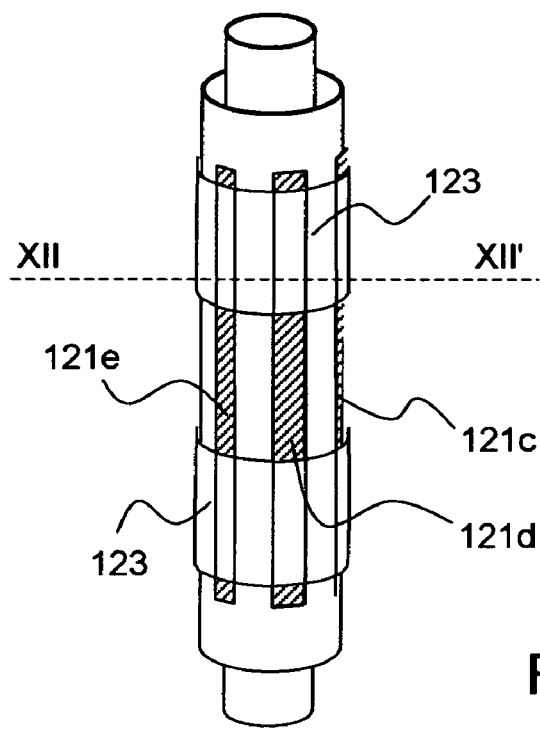
FIG. 12a shows a perspective view of a hybrid Birdcage resonator with six bars, wherein designs of the bars are described in FIG. 13a/b in accordance with the invention and in FIG. 14a/b in accordance with prior art.
Figure 12B:
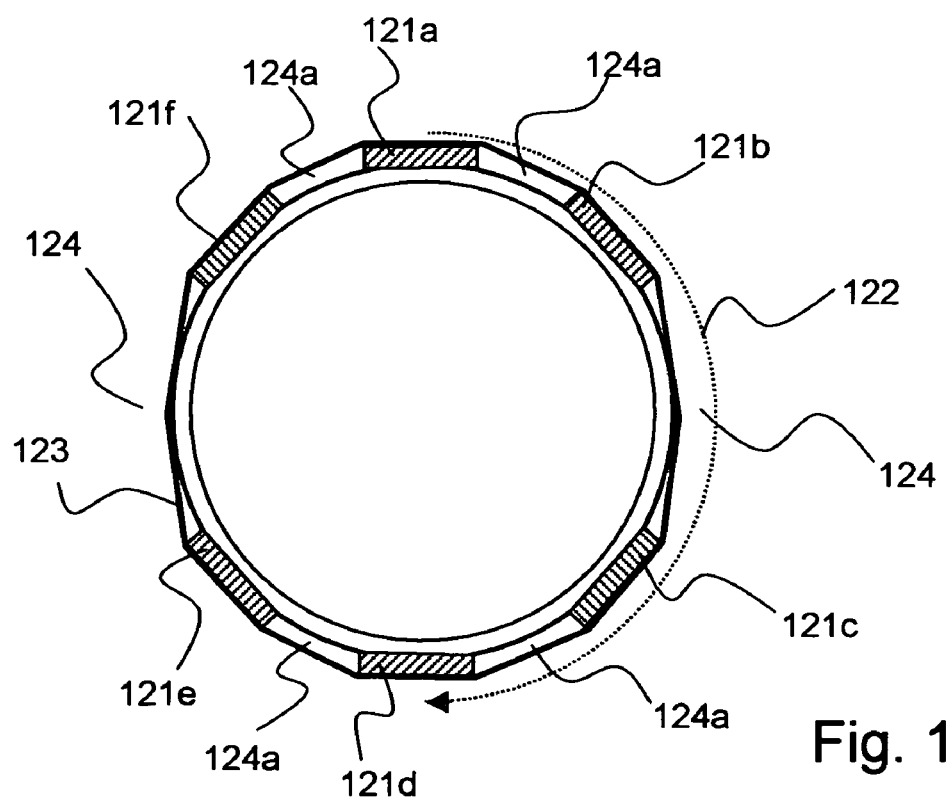
FIG. 12b shows a cross-section of the hybrid Birdcage resonator of FIG. 12a in the sectional plane XII–XII' thereby characterizing the illustrated region of the current distributions of FIG. 13b/14b.

FIG. 12 shows an example of a hybrid Birdcage resonator in perspective view. This resonator comprises a total of six bars, of which three bars 121c, 121d, 121e are shown in FIG. 12a. The bars each consist of several straight parallel conducting elements. For reasons of simplicity, the individual conducting elements of the bars 121c–121e are not shown individually in FIG. 12a but only their region is marked. The bars 121c–121e are overlapped by two metal foils 123. FIG. 12b shows a sectional view along the plane XII–XII' of FIG. 12a. The six bars 121a–121f and two windows 124 are all regularly disposed around the center of the hybrid Birdcage resonator. The arrow 122 shows the direction of illustration of a local coordinate P in FIG. 13b/14b, which shows the distribution of the amplitudes of the maximum alternating currents in the conducting elements during operation of an inventive Birdcage resonator (FIG. 13b) and of a conventional Birdcage resonator (FIG. 14b). In principle, the spaces 124a between neighboring bars 121a–121f can also be regarded as further small windows.

Figures 13A, 14A:
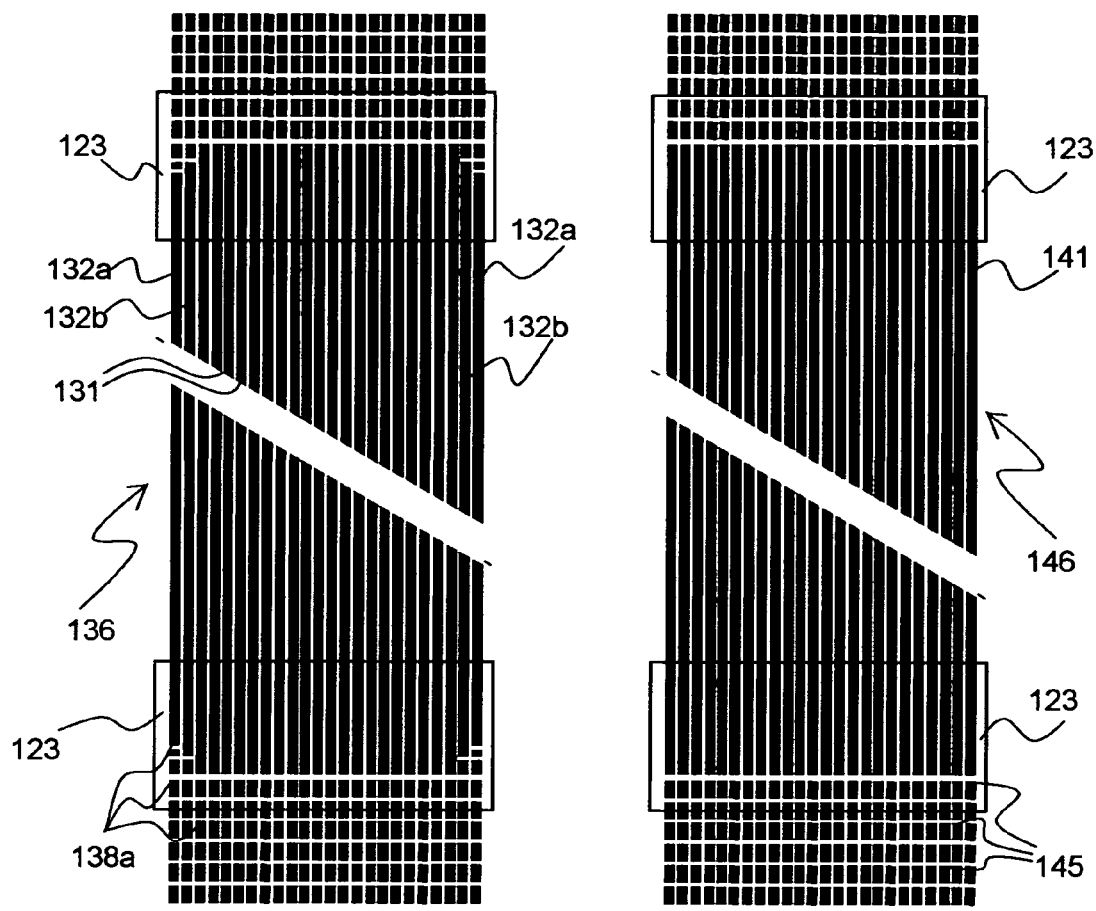
FIG. 13a shows a packet of conducting elements (bar) of a hybrid Birdcage resonator as in FIG. 12a/b in accordance with the invention.
FIG. 14a shows a packet of conducting elements (bar) of a hybrid Birdcage resonator as in FIG. 12a/b in accordance with prior art.
Figures 13B, 14B:
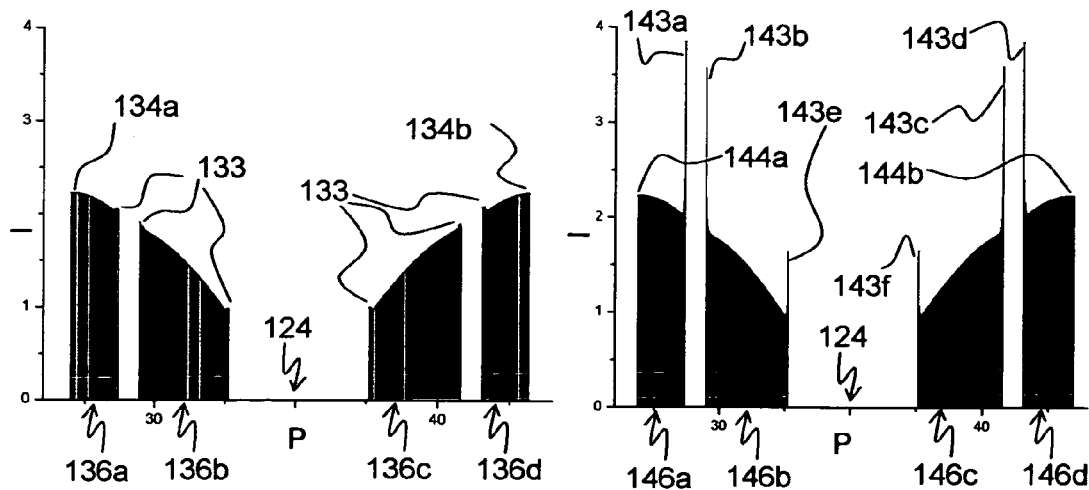
FIG. 13b shows the current distribution in four packets of conducting elements of a hybrid Birdcage resonator with bars as in FIG. 13a in accordance with the invention.
FIG. 14b shows the current distribution in four packets of conducting elements of a hybrid Birdcage resonator with bars as in FIG. 14a in accordance with prior art.

The bars are described in more detail in FIG. 13a/b for the inventive Birdcage resonator and in 14a/b for a conventional Birdcage resonator. The bars 136, 146 consist of a plurality of straight parallel oriented conducting elements 131, 132a, 132b, 141 which are approximately disposed in one plane (the illustration of the conducting elements 131, 132a, 132b, 141 is interrupted in the center to improve clarity). The conducting elements 131, 132a, 132b, 141 are continued at the top and bottom with galvanically insulated plates 138a, 145 to minimize the magnetization effects [9, 10]. The conducting elements 131, 132a, 132b, 141 are produced from HTS material and are disposed on a substrate which simultaneously serves as a dielectric. The conducting elements are located in FIG. 12b on the inner side of the bars 121a–121f to prevent formation of galvanic contact between the conducting elements and the metal foil 123.

In accordance with prior art (FIG. 14a), the conducting elements 141 have identical lengths and their ends are overlapped by metal foils 123 which are separated by a dielectric, thereby forming capacitances which are identical for all conducting elements 141. The region of the ends of the conducting elements 141 comprise galvanically insulated plates 145 which cause a macroscopically homogeneous distribution of superconducting material in accordance with [10]. Several bars 146 which are assembled using a metal foil 123 or a metallic ring form a hybrid Birdcage resonator.

In this conventional hybrid Birdcage resonator, the global current distribution over the bars of the Birdcage is approximately sinusoidal. FIG. 14b shows the currents in four bars 146a–146d, symmetrically with respect to one of the windows 124, for a birdcage resonator with six bars. The local coordinate P corresponds to the arrow 122 in FIG. 12b; the outer bars 146a, 146d in FIG. 14b, corresponding to 121a, 121d in FIG. 12b are only half shown. The current at the edges of the bars 146a–146d is, however, substantially higher than towards the center of the bars 146a–146d. The current strength at the positions 143a–143d is greater than the current strength of the maximum 144a, 144b of the sinusoidal current distribution in the resonator. These positions 143a–143d have peak-shaped current excesses which can cause a premature local quench in case of high load of the resonator. Further current peaks with a smaller amplitude than the maximum 144a, 144b are present at the positions 143e and 143f.

In an inventive Birdcage resonator coil (see illustration of a corresponding bar 136 in FIG. 13a) each bar is subdivided into many conducting elements 131, 132a, 132b. The bar 136 therefore comprises a set of conducting elements. The conducting elements 131, 132a, 132b are overlapped by metal foils 123 separated by dielectric. Galvanically insulated plates 138a are provided for macroscopic homogenization of the superconducting material in the region of the ends of the conducting elements 131, 132a, 132b (see [10]). The capacitance formed between the individual conducting elements 131, 132a, 132b and the metal foil 123 is adjusted such that the global current distribution is sinusoidal, i.e. the peak-shaped current excesses are eliminated. This also improves the homogeneity of the B1 field. Adjustment is effected in this example through shortening the outer, i.e. edge conducting elements 132a, 132b compared to the further inward conducting elements 131, which have a uniform length. The further outward conducting elements 132a are thereby shortened to a larger degree than the further inward conducting elements 132b. In the example shown, only the two outer conducting elements 132a, 132b are shortened. If more conducting elements are provided in the bar (i.e. if the conducting element packet is larger), larger groups of conducting elements can also be shortened. Alternatively, the width of the conducting elements 131, 132a, 132b may also be changed as well as the layer thickness or the material of the dielectric providing the capacitance.

The inventive capacitance adjustment weakens the current maxima 133 which occur at the edge positions of the bars (compare the current distribution in FIG. 13b to the four bars 136a–136d corresponding to 121a–121d in FIG. 12b) and symmetrically with respect to one of the two large windows 124 of an inventive Birdcage resonator having a total of six bars. In particular, the contributions of the current maxima 133 are smaller than the contributions of the current strengths of the maxima 134a, 134b of the desired sinusoidal current distribution.

In an alternative embodiment of the invention, the current can be adjusted to be equally distributed across all conductor paths of a Birdcage resonator (on each bar or on all bars) which would yield maximum current carrying capacity but reduce the B1 homogeneity of the coil.

A homogeneous B1 field may be introduced as a further requirement of the design of the current densities in the conducting elements of an RF resonator.

While the above-described inventive arrangements consider to a certain degree a high density of conductor paths or conducting elements as an additional condition, this additional condition may be replaced by the additional condition of high B1 field homogeneity.

Since RF currents generally flow in the outer region of the conducting elements, conducting elements having a small cross-section are advantageously used to minimize distortions in the magnetic field through local current distributions in the conducting element. The conducting elements can then be regarded as being linear in the calculations.

The field homogeneity of a resonator arrangement as shown in FIG. 15c can be easily improved. The resonator pairs 151, 152 and 153 which are disposed about the sample 154 to be measured may then be designed in accordance with the embodiment of the invention of FIG. 15a/15b. To obtain maximum field homogeneity in the x-y plane, the current in an outer region must be higher than in an inner region of the resonator. If the currents are equally large in each conducting element, in accordance with the invention, the density of the conducting elements is increased towards the outside, i.e. away from the sample.

To enable a larger RF magnetic field and therefore a larger total current in the RF resonator, in accordance with the invention, the conducting elements which form the RF resonator are selected and disposed such that the maximum current density which occurs in an operating state along any conducting element, divided by the maximum admissible current density at the location of maximum current density in this conducting element assumes substantially a certain desired value which is the same for all conducting elements in the RF resonator. If few conducting elements are provided, in particular, in the edge region of the RF resonator, the desired value may be reduced. Alternatively, inventive selection and arrangement of the conducting elements in RF resonators which have a certain desired current distribution in usually similar conducting elements, ensures that the current flow in any conducting element is not larger than the current flow in that conducting element having the highest current strength in accordance with the desired current distribution. This prevents local, peak-shaped current excesses which can occur e.g. at the edge of bars of Birdcage resonators.

In inventive superconducting resonators, a premature local quench of individual conducting elements can be prevented and the linear region of the resistance characteristic can be substantially enlarged, and in inventive normally-conducting resonators, the more uniform current density distribution leads to a higher resonator Q-value.

List of Literature

[1] Wong et al. U.S. Pat. No. 6,590,394 B2 July, 2003
[2] Withers U.S. Pat. No. 6,556,013 B2 April, 2003
[3] Brey et al. U.S. Pat. No. 5,619,140 A April, 1997
[4] Brey et al. U.S. Pat. No. 5,594,342 A January, 1997
[5] Withers U.S. Pat. No. 5,585,723 A December, 1996
[6] Brey et al. U.S. Pat. No. 5,565,778 A October, 1996
[7] Withers et al. U.S. Pat. No. 5,351,007 A September, 1994
[8] Withers et al. U.S. Pat. No. 5,276,398 January, 1994
[9] Marek U.S. Pat. No. 6,121,776 September, 2000
[10] Marek U.S. Pat. No. 6,605,945 August, 2003

We claim:

1. A radio-frequency (RF) resonator system, the system comprising:
at least one RF resonator having at least three non-interrupted conducting elements which are disposed to define at least one window in said RF resonator, with only a part of said conducting elements delimiting said at least one window, said conducting elements being coupled to each other via electromagnetic fields, and each of said conducting elements has a position-dependent limiting current density which should not be exceeded during operation, wherein eigen-resonances of the individual conducting elements and/or electromagnetic coupling among said conducting elements are selected to avoid substantial deviations from a monotonic distribution of current densities in neighboring conducting elements such that a maximum RF field strength of said resonator is not limited by an excessive current density in an isolated conducting element or in an isolated group of conducting elements.

2. The RF resonator system of claim 1, wherein, upon excitation of the RF resonator system, maxima of quotient values along individual conducting elements are substantially equal for all conducting elements, said quotient values being defined by a quotient between an average current density occurring in a cross-section of the conducting elements to a respective local limiting current density.

3. A method for designing the RF resonator system of claim 2 with homogeneous current utilization, the method comprising the following steps:
a) designing an RF resonator system;
b) calculating a current distribution in the RF resonator system for a desired resonance mode;
c) calculating maximum values $Q_i$ of quotient values along individual conducting elements i;
d) adjusting eigen-resonances of individual conducting elements or electromagnetic couplings between conducting elements through adjustment of lengths or of ratios between separations and widths of capacitive overlappings between neighboring conducting elements or through replacement of straight conducting sections by meandering sections, the adjusting being carried out in dependence on a respective deviation of a value $Q_i$, calculated in step c), from a reference value, wherein said reference value may be equal to a minimum, a maximum or an average value of the $Q_i$ values calculated in step c); and
e) repeating steps b) through d) until all values $Q_i$ are substantially equal to said reference value.

4. The RF resonator system of claim 1, wherein peak-shaped current excesses along individual conducting elements or along conductor groups of several conducting elements are substantially eliminated.

5. The RF resonator system of claim 4, wherein said current excesses occur in an edge region of packets of conducting elements or at an edge of said at least one window.

6. A method for designing the RF resonator system of claim 4, the method comprising the following steps:
a) designing an RF resonator system;
b) calculating a current distribution in the RF resonator system for a desired resonance mode;
c) calculating maximum values $Q_i$ of quotient values along individual conducting elements i;
d) selecting conducting elements k in edge regions with peak-shaped current excesses whose maximum quotient values are $Q_k$;
e) adjusting eigen-resonances of individual conducting elements k or electromagnetic couplings between conducting elements through adjustment of lengths or of ratios between separations and widths of capacitive overlappings between neighboring conducting elements or by replacing straight conducting sections with meandering sections, the adjusting being carried out in dependence on a respective deviation of the values $Q_k$, calculated in step c), from a reference value, wherein said reference value is smaller than a maximum $Q_i$ value outside of said selected edge regions; and
f) repeating steps b) through e) until all values $Q_k$ are smaller than or equal to said reference value.

7. The RF resonator system of claim 1, wherein said conducting elements are produced from superconducting material, from NbTi, or from $Nb_3Sn$.

8. The RF resonator system of claim 7, wherein said conducting elements are produced from high-temperature superconducting material with a transition temperature >30K.

9. The RF resonator system of claim 1, wherein said conducting elements are disposed on a flat, polyhedral or cylindrical, dielectric substrate.

10. The RF resonator system of claim 1, wherein said conducting elements have an approximately rectangular cross-section, a cross-section with a thickness of between 200 nm and 1 µm, or a cross-section having a width between 2 µm and 50 µm.

11. The RF resonator system of claim 1, wherein limiting current densities in all said conducting elements of said resonator are substantially equal.

12. The RF resonator system of claim 1, wherein said conducting elements of said RF resonator each have substantially equal cross-sections at a location of their respective maximum quotient values.

13. The RF resonator system of claim 1, wherein one or more of said conducting elements comprises a meandering section or a meandering section disposed in a region of a base of a U-shaped conducting element.

14. The RF resonator system of claim 13, wherein said two planes are disposed parallel and proximate to each other and are connected by a dielectric layer.

15. The RF resonator system of claim 1, wherein different pairs of said conductor elements have different capacitive overlappings.

16. The RF resonator system of claim 1, wherein a ratio between a width and a separation of different conductor pairs differs.

17. The RF resonator system of claim 1, wherein said RF resonator comprises four sets of nested U-shaped conducting elements, wherein U-shaped conducting elements of each set are open towards a center of said RF resonator, and, within each set of U-shaped conducting elements, ends of legs of further outward U-shaped conducting elements are backed off relative to ends of the legs of further inward U-shaped conducting elements, wherein opening directions of said U-shaped conducting elements of two sets face one another and are disposed in one plane, with U-shaped conducting elements of the two sets of each plane not engaging, wherein opening directions of said U-shaped conducting elements in a first plane are rotated by 90° relative to opening directions of said U-shaped conducting elements in a second plane.

18. The RF resonator system of claim 1, wherein said RF resonator comprises two sets of U-shaped conducting elements, wherein U-shaped conducting elements of each set are nested and open towards a same direction, with opening directions of said U-shaped conducting elements of said two sets facing each other, wherein legs of said U-shaped conducting elements of said two sets engage each other, with exactly one leg of a conducting element of one set engaging between two neighboring legs of conducting elements of an other set, and, in an inner region which borders said window, an engagement depth of legs of said U-shaped conducting elements into spaces in said RF resonator decreases from an inside to an outside.

19. The RF resonator system of claim 18, wherein, in an outer region, said engagement depth of said legs of said U-shaped conducting elements into said spaces in said RF resonator increases again from an inside to an outside.

20. The RF resonator system of claim 1, wherein the system comprises several, two, or four RF resonators of a same design.

21. The RF resonator system of claim 1, wherein said RF resonator comprises at least one set of straight, parallel said conducting elements, said conducting elements having identical lengths in a central region of said set, and, in outer regions of said set, further outward conducting elements are shorter than further inward conducting elements.

22. The RF resonator system of claim 21, wherein said RF resonator is a Birdcage resonator or a hybrid Birdcage resonator and comprises several sets of straight, parallel said conducting elements.

23. The RF resonator system of claim 1, the system being part of an NMR probe head having a sample to be measured, wherein said conducting elements are placed on a flat, polyhedral, of cylindrical dielectric substrate, said conducting elements being spatially arranged such that an RF magnetic field generated in an active volume of the sample is as homogeneous as possible.

24. The RF resonator system of claim 1, wherein neighboring conducting elements are galvanically connected or are galvanically connected at locations having a same electric potential.

* * * * *